United States Patent
Chen

(10) Patent No.: US 12,119,256 B2
(45) Date of Patent: Oct. 15, 2024

(54) REPLACING END EFFECTORS IN SEMICONDUCTOR PROCESSING SYSTEMS

(71) Applicant: ASM IP Holding B.V., Almere (NL)

(72) Inventor: Dongyang Chen, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 485 days.

(21) Appl. No.: 17/467,250

(22) Filed: Sep. 5, 2021

(65) Prior Publication Data
US 2022/0076986 A1 Mar. 10, 2022

Related U.S. Application Data

(60) Provisional application No. 63/075,650, filed on Sep. 8, 2020.

(51) Int. Cl.
*H01L 21/687* (2006.01)

(52) U.S. Cl.
CPC .............................. *H01L 21/68707* (2013.01)

(58) Field of Classification Search
CPC ......... H01L 21/68707; H01L 21/67766; H01L 21/67742; B25J 9/042; B25J 9/043; B25J 11/0095; B25J 19/0066
See application file for complete search history.

(56) References Cited

U.S. PATENT DOCUMENTS

| | | | |
|---|---|---|---|
| 6,394,440 B1 | 5/2002 | Carrell |
| 6,585,478 B1 | 7/2003 | Wood |
| 6,696,367 B1 | 2/2004 | Aggarwal |
| 6,704,496 B2 | 3/2004 | Jacobson |
| 6,823,753 B1 | 11/2004 | Beginski |
| 6,861,321 B2 | 3/2005 | Keeton |
| 6,900,877 B2 | 5/2005 | Raaijmakers |
| 7,008,802 B2 | 3/2006 | Lu |
| 7,231,141 B2 | 6/2007 | Jacobson |
| 7,235,806 B2 | 6/2007 | Beginski |
| 7,537,662 B2 | 5/2009 | Soininen |
| 7,601,223 B2 | 10/2009 | Lindfors |
| 9,343,350 B2 | 5/2016 | Arai |
| 9,370,863 B2 | 6/2016 | Tsuji |
| 9,640,416 B2 | 5/2017 | Arai |
| 10,290,523 B2 | 5/2019 | Nozawa |

(Continued)

FOREIGN PATENT DOCUMENTS

TW 201802887 A 1/2018

*Primary Examiner* — Gerald McClain
(74) *Attorney, Agent, or Firm* — Snell & Wilmer L.L.P.

(57) ABSTRACT

A method of replacing an end effector for wafer handling in a semiconductor processing system includes fixing a first end effector jig to a first stage and a second end effector jig to a second stage of the load lock module; positioning a first end effector at the first end effector jig and a second end effector at the second end effector jig, the second end effector fixed relative to the first end effector; and fixing the second end effector to the second end effector jig. The first end effector is replaced with a replacement end effector and the semiconductor processing system returned to production without re-teaching placement of the replacement end effector in a processing module connected to a wafer handling module mounting the end effectors. Semiconductor processing systems and end effector jigs for replacing end effectors in semiconductor processing systems are also described.

19 Claims, 12 Drawing Sheets

(56) References Cited

U.S. PATENT DOCUMENTS

| | | |
|---|---|---|
| 10,403,523 B2 | 9/2019 | Kim |
| 10,707,106 B2 | 7/2020 | Mori |
| 11,049,751 B2 | 6/2021 | De Ridder |
| 11,488,854 B2 | 11/2022 | Kim |
| 11,600,503 B2 | 3/2023 | Mori |
| 2005/0034288 A1* | 2/2005 | Adachi ............ H01L 21/67259 29/25.01 |
| 2010/0222923 A1* | 9/2010 | Matsumura ....... H01L 21/68707 700/245 |
| 2015/0332949 A1 | 11/2015 | Mori |
| 2016/0340780 A1 | 11/2016 | Swan |
| 2017/0095927 A1* | 4/2017 | Fadlovich .............. B25J 11/005 |
| 2018/0269088 A1* | 9/2018 | Nozawa ................. H01L 21/68 |
| 2020/0086503 A1* | 3/2020 | Johnson ................. B25J 9/1664 |
| 2021/0122585 A1* | 4/2021 | Johnson ............... B65G 47/914 |
| 2021/0375654 A1 | 12/2021 | Oosterlaken |
| 2022/0076986 A1 | 3/2022 | Chen |
| 2023/0022174 A1 | 1/2023 | Kobayashi |
| 2023/0091979 A1 | 3/2023 | Dammura |
| 2023/0100356 A1* | 3/2023 | Chen ................ H01L 21/67742 118/728 |
| 2023/0105844 A1* | 4/2023 | Chen ..................... B25J 9/1692 700/121 |

* cited by examiner

REPLACING END EFFECTORS IN SEMICONDUCTOR PROCESSING SYSTEMS

CROSS-REFERENCE TO RELATED APPLICATIONS

This application claims priority to U.S. Application No. 63/075,650, filed on Sep. 8, 2020 in the United States Patent and Trademark Office, the disclosure of which is incorporated herein in its entirety by reference.

FIELD OF INVENTION

The present disclosure generally relates to wafer handling in semiconductor processing systems. More particularly, the present disclosure relates to replacing end effectors in wafer handling modules employed by semiconductor processing systems.

BACKGROUND OF THE DISCLOSURE

Semiconductor processing systems commonly employ wafer handling modules to place wafers in and retrieve wafers from processing modules. The processing modules generally include reaction chambers pairs, each reaction chamber in turn having a processing stage, and the processing stages in the reaction chamber pairs mechanically offset from one another. The wafer handling module generally includes a pair of end effectors arranged for placing wafers on the processing stages within the reaction chamber pairs for deposition of film onto the wafer while positioned on the processing stage. Since uniformity of the film can be influenced by placement of the wafer of the processing stage, and the spacing between a given pair of processing stages differing from a nominal value due manufacturing variation of the given pair of processing stages, it is typically necessary to teach the wafer handling module the location of each processing stage for each pair of processing stages in the processing module. Teaching is typically accomplished using a setup process, accomplished prior to commissioning the processing module for production, and during which the offsets the pair of processing stage from nominal for precise wafer placement on the processing stages are established.

Teaching placement of the end effectors in the reaction chambers typically involves measuring effort between the center of the processing stage and the center of a wafer once placed on the processing stage by the end effector assigned to the processing stage. Based on the measured placement error of the wafer on the processing stage, offsets are generated to correct wafer placement and applied to wafers subsequently placed onto the processing stage by the end effector. Error between the center of the processing stage and the center of the wafer may again be measured and compared to a placement error tolerance, and offsets updated or accepted based on the amount of residual placement error observed in the placement of wafers subsequently placed on the processing stage. In some processing modules, measuring placement error entails installing a transparent cover on the process module. Such transparent covers allow for measuring placement error visually and/or with an external imaging device, facilitating generating the offset required for end effectors servicing the processing module.

While the teaching process employed during such setups is generally able to provide good control over the placement of wafers on the processing stages in process modules, the need to re-teach end effector placement within processing modules can prolong certain post-commissioning service events. For example, during end effector replacement, it may be necessary to re-install the transparent cover to re-teach placement of the end effector in the reaction chamber, remove the transparent cover and return the processing module to its production configuration, and re-qualify the processing module for production. This may make the replacement event longer than would otherwise be required without the re-teaching of the end effector placement within the processing module.

Such systems and methods have generally been considered suitable for their intended purpose. However, there remains a need in the art for improved methods of replacing end effectors, semiconductor processing systems, and end effector jigs. The present disclosure provides a solution to one or more of these needs.

SUMMARY OF THE DISCLOSURE

A method of replacing an end effector for wafer handling in a semiconductor processing system is provided. The method includes fixing a first end effector jig to a first stage and a second end effector jig to a second stage of the load lock module; positioning a first end effector at the first end effector jig and a second end effector at the second end effector jig, the second end effector fixed relative to the first end effector; and fixing the second end effector to the second end effector jig. The first end effector is replaced with a replacement end effector and the semiconductor processing system returned to production without re-teaching placement of the replacement end effector in a processing module connected to a wafer handling module mounting the end replacement end effector and the second end effector.

In certain examples, the method may include acquiring a first end effector position baseline using a fixed sensor while transferring a wafer between the first stage and the first end effector.

In certain examples, the method may include acquiring a replacement end effector target position using a carried sensor while transferring a camera wafer between the first stage and the first end effector.

In certain examples, the method may include adjusting position of the replacement end effector based on a comparison of position of the replacement end effector with a replacement end effector target position.

In certain examples, the method may include aligning the replacement end effector with the first end effector jig while the second end effector is fixed to the second stage.

In certain examples, the method may include verifying position of the replacement end effector based on a comparison of the position of the replacement end effector with a first end effector position baseline.

In certain examples, the replacement end effector may be a first replacement end effector, the method may further include fixing the first replacement end effector to the first end effector jig, replacing the second end effector with a second replacement end effector, and returning the semiconductor processing system to production without re-teaching placement of the second replacement end effector in the processing module connected to the load lock module by the back-end wafer handler module.

In certain examples, the method may include acquiring a second end effector position baseline using a fixed sensor while transferring a wafer between the second stage and the second end effector.

In certain examples, the method may include acquiring a second replacement end effector target position using a carried sensor while transferring a camera wafer between the second stage and the second end effector.

In certain examples, the method may include adjusting position of the second replacement end effector based on a comparison of position of the second replacement end effector with a second replacement end effector target position.

In certain examples, the method may include verifying position of the second replacement end effector based on a comparison of the position of the second replacement end effector with a second end effector position baseline.

In certain examples, the second replacement end effector may be aligned with the second end effector jig while the first replacement end effector is fixed to the first stage.

In certain examples, the method may include installing a transparent cover on the processing module and teaching placement of the first end effector in the processing module by observing first end effector placement in the processing module through the transparent cover.

In certain examples, the method may include installing a transparent cover on the processing module and teaching placement of the second end effector in the processing module by observing second end effector placement in the processing module through the transparent cover.

A semiconductor processing system is also provided. The semiconductor processing system includes a front-end wafer handling module; a load lock module connected to the front-end wafer handling module, the load lock module having a first stage and a second stage; and a back-end wafer handling module connected to the load lock module, the back-end wafer handling module having a first end effector and a second end effector. A processing module is connected to the back-end wafer handling module, the processing module having a first processing stage and a second processing stage; a first end effector jig is fixed to the first stage of the load lock module; and a second is jig fixed to the second stage of the load lock module. Placement of the first end effector in the first processing stage of the processing module corresponds to alignment of the first end effector on the first end effector jig. Placement of the second end effector in the second processing stage of the processing module corresponds to alignment of the second end effector on the second end effector jig.

In certain examples, a fixed sensor may be fixed relative to the first stage of the load lock module and configured to acquire a first end effector position baseline using the fixed sensor while transferring a wafer between the first stage and the first end effector.

In certain examples, a carried sensor may be carried by the first end effector and configured to acquire a replacement end effector target position using the carried sensor while transferring a camera wafer between the first stage and the first end effector.

In certain examples, the first end effector jig and the second end effector jig may be identical to one another.

In certain examples, the first end effector may be fixed to the first stage by the first end effector jig and the second end effector may be aligned to the second end effector jig.

In certain examples, the second end effector may be fixed to the second stage by the second end effector jig and the first end effector may be aligned to the first end effector jig.

An end effector jig for aligning a replacement end effector to a load lock module in a semiconductor processing system is further provided. The end effector jig includes a stage surface with a stage alignment aperture and a stage fixation aperture; an end effector surface with an end effector surface alignment aperture, an end effector surface fixation aperture, and a step; a stage alignment pin and a stage fastener configured for alignment and fixation of the end effector jig to the stage of the load lock module; and an end effector pin set configured for alignment and fixation of an end effector to the end effector jig. The step is arranged between stage surface and the end effector surface such that an end effector may overlay the end effector jig.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
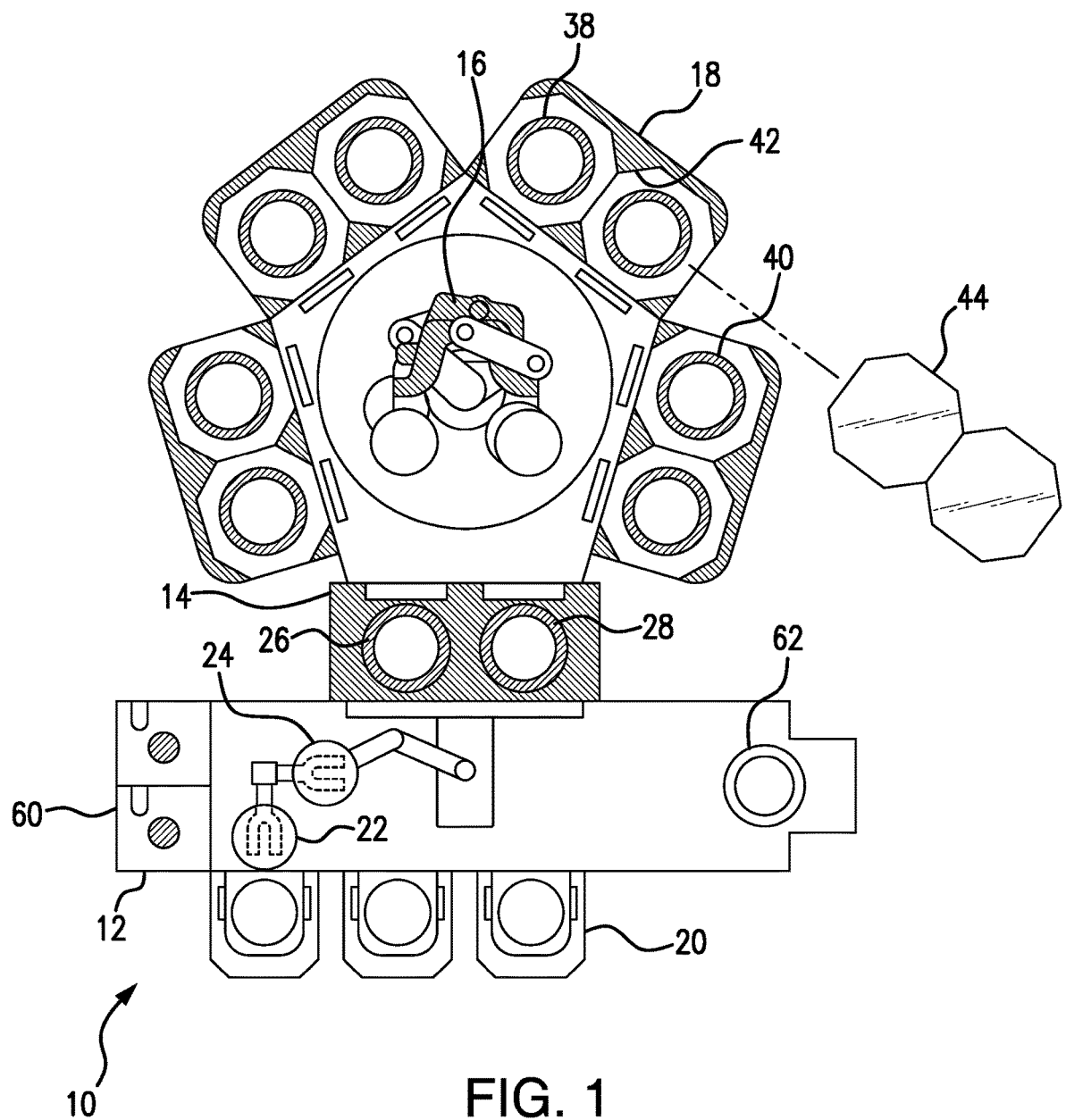
FIG. 1 is a plan view of a semiconductor processing system constructed in accordance with the present disclosure, showing load lock module connected to a processing module by a back-end wafer handling module.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a block diagram of a method of replacing an end effector for wafer handling in a semiconductor processing system in accordance with the disclosure is shown in FIG. 16 and is designated generally by reference character 300. Other embodiments of methods of replacing end effectors, semiconductor processing systems, and end effector jigs for fixing and aligning end effectors to semiconductor processing system in accordance with the present disclosure, or aspects thereof, are provided in FIGS. 1-15, 17 and 18, as will be described. The systems and methods described herein can be used to replace end effectors in wafer handling modules in chemical vapor deposition (CVD) systems used for epitaxial deposition operations, such as in back-end wafer handling modules for CVD systems, though the present disclosure is not limited to CVD systems or to depositing films using epitaxial deposition techniques in general.

Referring to FIG. 1, a semiconductor processing system 10 is shown. The semiconductor processing system 10 includes a front-end wafer handling module 12, a load lock module 14, a back-end wafer handling module 16, and a processing module 18. The front-end wafer handling module 12 has a load port 20, is connected to the load lock module 14, and is configured to transfer wafers, e.g., a first wafer 22 and a second wafer 24, between the load port 20 and the load lock module 14. In illustrated example the load lock module 14 further includes an aligner 60, for imparting shift in wafers associated with reaction chambers of the processing module 18 into which a given wafer is to be positioned, and a cold plate 62, for cooling wafers subsequent to deposition of films onto wafers subsequent to deposition of film onto wafers in the processing module 18. Although a particular arrangement of the semiconductor processing system 10 is shown, e.g., a semiconductor processing system having four (4) dual-chamber processing modules, it is to be understood and appreciated that semiconductor processing systems of types and/or having different arrangements can also benefit from the present disclosure.

Figure 4:
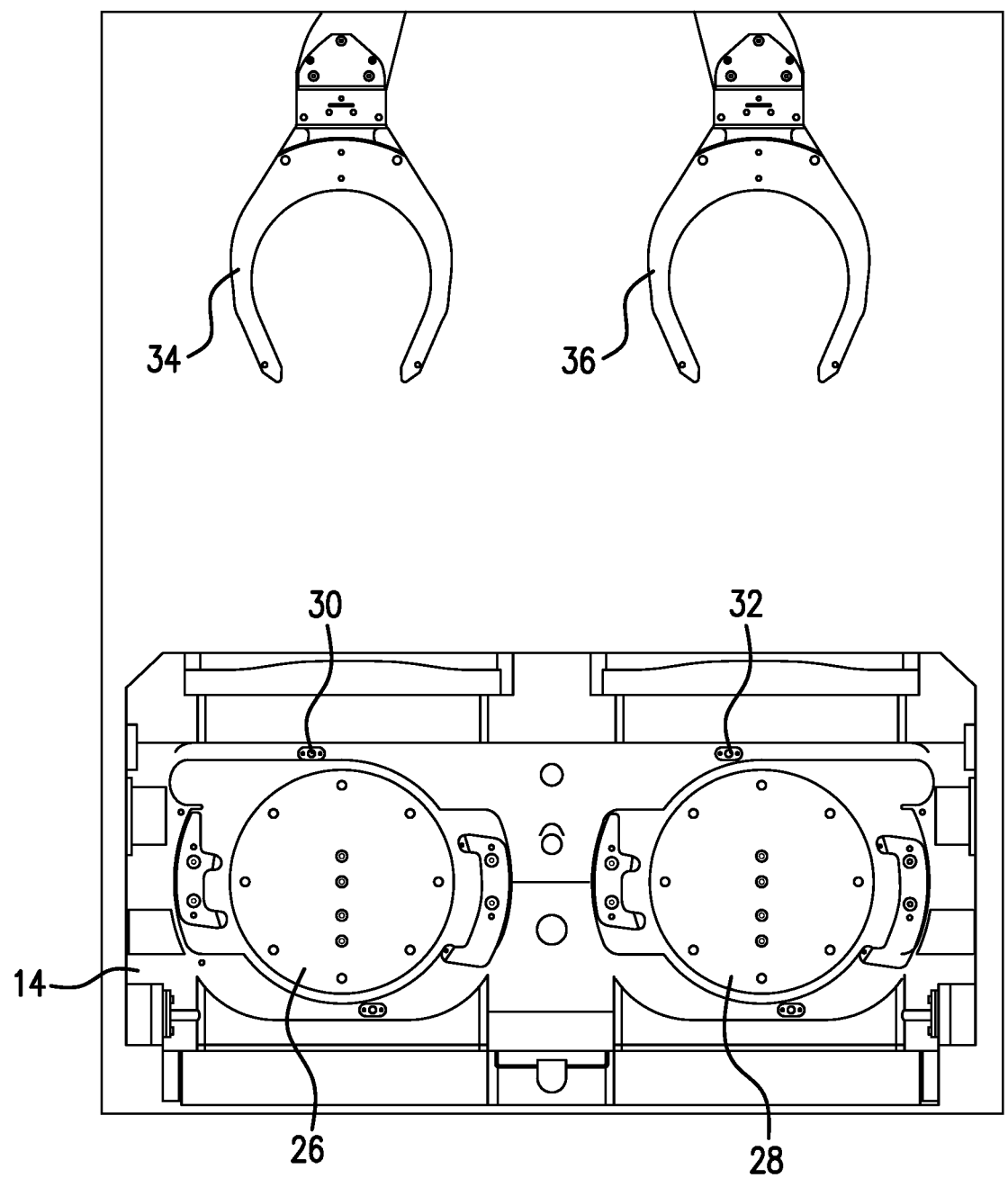
FIG. 4 is a plan view of the load lock module of FIG. 1, showing the first end effector and the second end effector offset from a first stage and a second stage of the load lock module in an initial state prior to replacement of either (or both) of the end effectors.

The load lock module 14 is connected to the front-end wafer handling module 12 and includes first stage 26, a second stage 28, a first fixed sensor 30 (shown in FIG. 4), and a second fixed sensor 32 (shown in FIG. 4). The first stage 26 are each within the range of motion of the front-end wafer handling module 12 and the back-end wafer handling module 16 and are configured to support thereon wafers, e.g., the first wafer 22 and the second wafer 24, during transfer between front-end wafer handling module 12 and the back-end wafer handling module 16. The first fixed sensor 30 is fixed relative to the load lock module 14 and is configured to determine position (centering) of a wafer, e.g., the first wafer 22 or the second wafer 24, as the wafer is being positioned onto the first stage 26. The second fixed sensor 32 is similar to the first fixed sensor 30 and is additionally configured to determine position (centering) as the wafer is being positioned onto the second stage 28.

In certain examples, the first fixed sensor 30 may be configured to acquire a baseline position of a first end effector 34 (shown in FIG. 2) of the back-end wafer handling module 16 during transfer of a wafer between the back-end wafer handling module 16 and the first stage 26. In accordance with certain examples, the second fixed sensor 32 may be configured to acquire a baseline position of a second end effector 36 (shown in FIG. 2) of the back-end wafer handling module 16 during transfer of a wafer, e.g., the second wafer 24, between the back-end wafer handling module 16 and the second stage 28. It is contemplated that, in certain examples, either (or both) the first fixed sensor 30 and the second fixed sensor 32 may be automatic wafer centering (AWC) sensors.

The processing module 18 includes a first processing stage 38, a second processing stage 40, and housing 42. The first processing stage 38 is within the movement range of the back-end wafer handling module 16 and in this respect is configured for the loading and unloading of wafers, e.g., the first wafer 22, from the first processing stage 38. The second processing stage 40 is also within the movement range of the back-end wafer handling module 16 and in this respect is configured for the loading and unloading of wafers, e.g., the second wafer 24, from the second processing stage 40. It is contemplated that the first processing stage 38 and the second processing stage 40 be arranged with the housing 42, and that the housing 42 be configured for flowing a precursor gas through processing module 18 for deposition of a film onto the surface of wafers positioned on the first processing stage 38 and the second processing stage 40. It is also contemplated that the housing 42 be configured to seat thereon a transparent cover 44 for teaching the placement of either (or both) the first end effector 34 (shown in FIG. 2) and the second end effector 36 (shown in FIG. 2) in the processing module 18 during operation of the semiconductor processing system 10. In certain examples the processing module 18 may include a dual-chamber processing module. In accordance with certain examples, the processing module may include a quad-chamber processing module.

Figure 2:
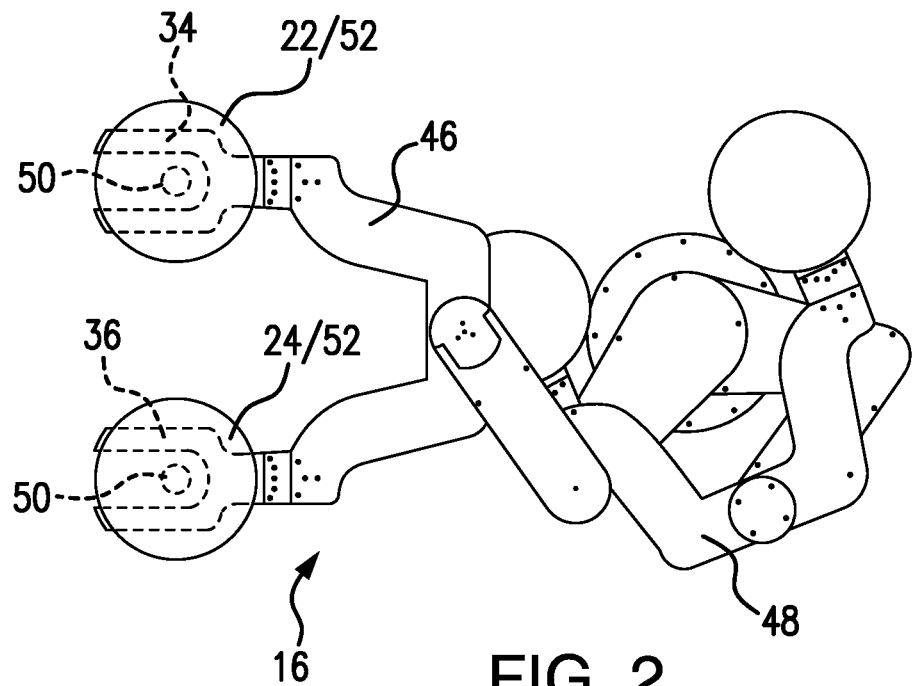
FIG. 2 is a plan view of the back-end wafer handling module of FIG. 1, showing first and second arms of the back-end wafer handling module supporting a wafer pair for acquiring end effector baselines or a camera wafer for acquiring replacement end effector target positions.
Figure 3:
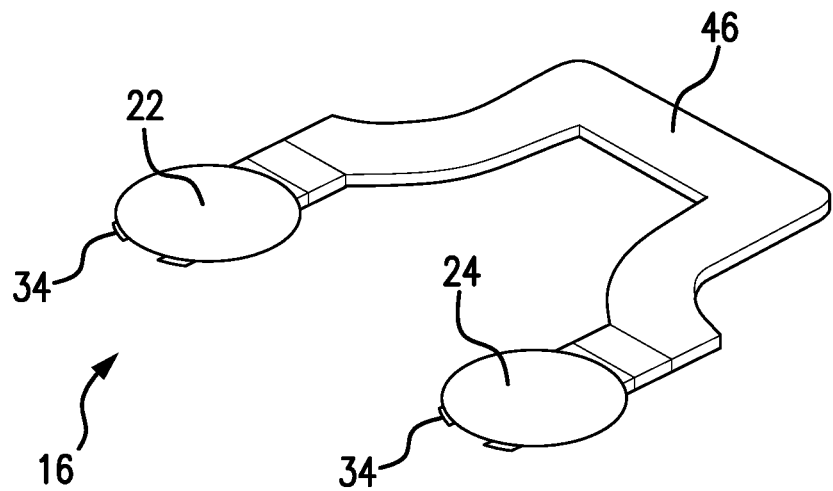
FIG. 3 is perspective view of a portion of the back-end wafer handling module of FIG. 1, showing a first end effector and a second end effector connected to the first arm, the second end effector fixed relative to the first end effector by the first arm.

With reference to FIGS. 2 and 3, portions of the back-end wafer handling module 16 are shown. As shown in FIG. 2, the back-end wafer handling module 16 is connected to the load lock module 14 (shown in FIG. 1) and the processing module 18 (shown in FIG. 1) and include a first arm 46 and a second arm 48. As shown in FIG. 3, the first arm 46 mounts the first end effector 34 and the second end effector 36, the second end effector 36 fixed relative to the first end effector 34 by the first arm 46 of the wafer handling module 14. The second arm 48 is similar to the first arm 46 and is additionally movably fixed to the first arm 46. As will be appreciated by those of skill in the art in view of the present disclosure, although a back-end wafer handling module having two (2) arms is shown and described herein, those of skill in the art will appreciate that semiconductor processing systems having one (1) arm or more than (2) two arms can also benefit from the present disclosure.

Figure 12:
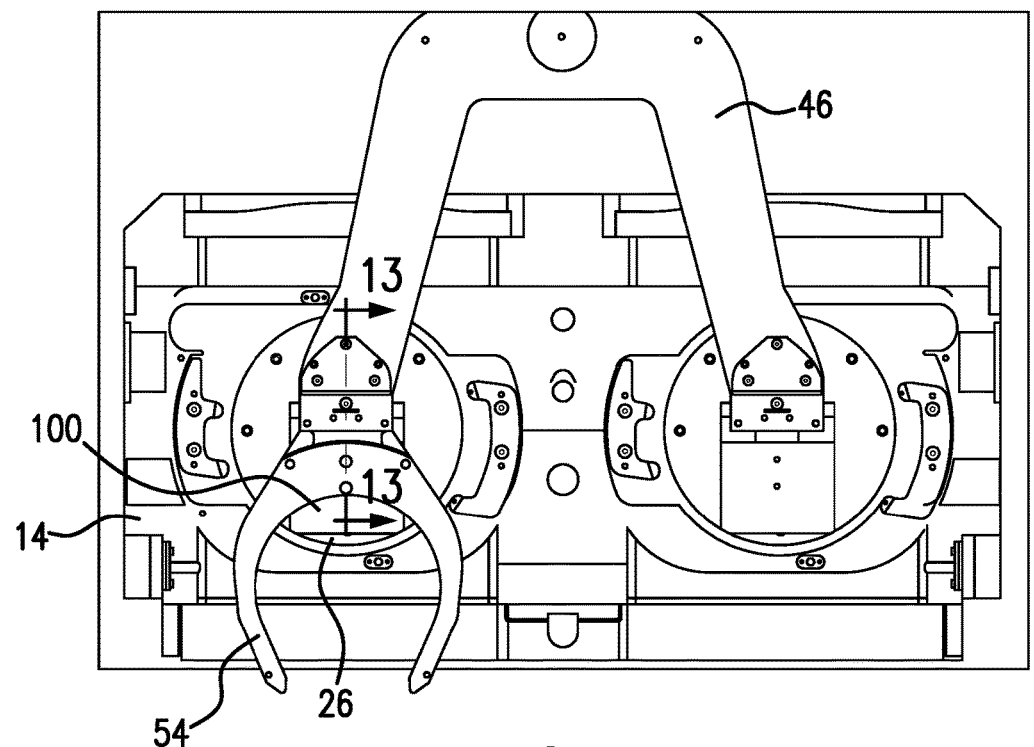
FIGS. 12 and 13 are plan and cross-sectional views of the load lock module of FIG. 1, showing the second end effector removed from the wafer handler module while the first replacement end effector is fixed to the first end effector jig by the first end effector jig pin set.
Figure 13:
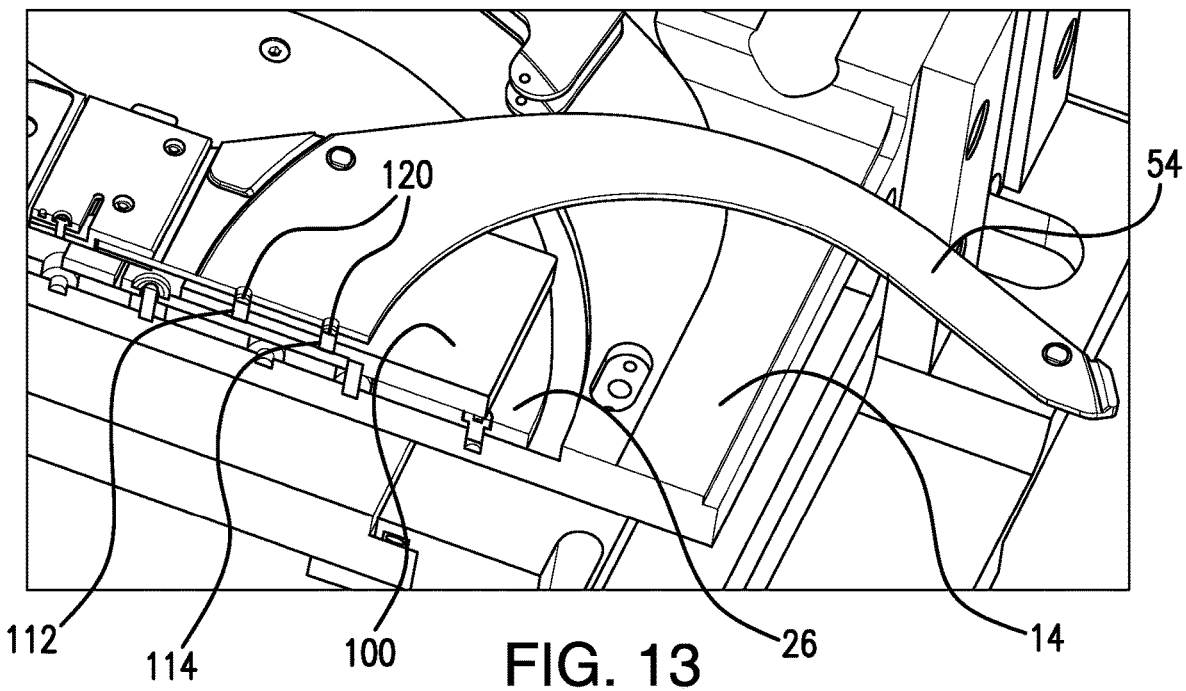
Figure 14:
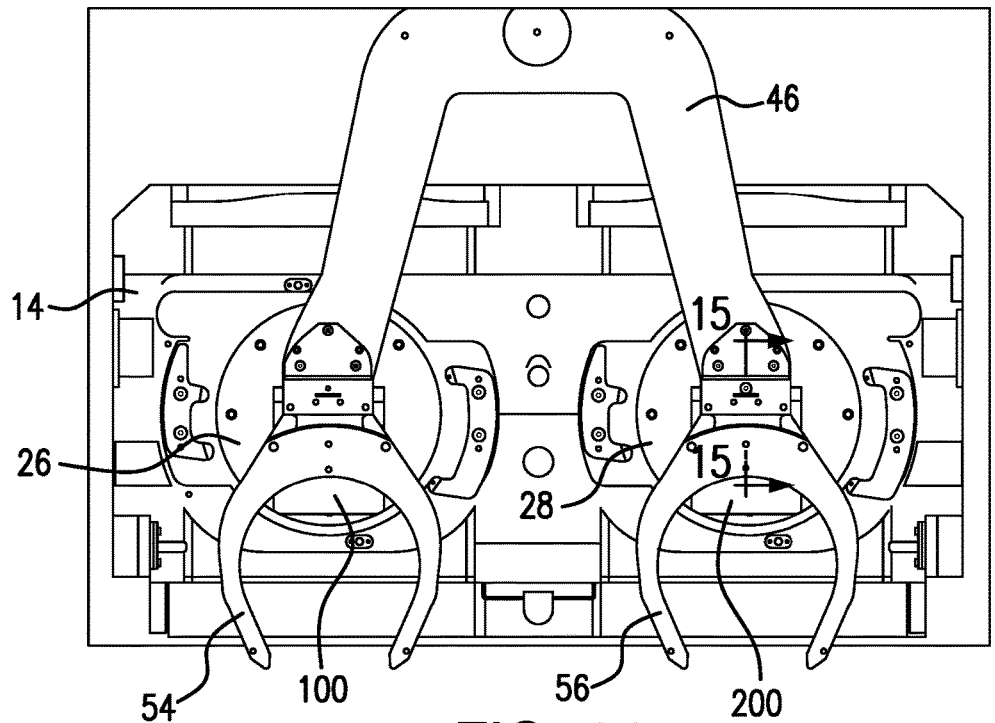
FIGS. 14 and 15 are plan and cross-sectional views of the load lock module of FIG. 1, showing a second replacement end effector attached to the wafer handler module and aligned to the second end effector jig while the first replacement end effector is fixed to the first stage.

With reference to FIGS. 4-15, the first end effector 34 and the second end effector 36 are shown being replaced by a first replacement end effector 54 (shown in FIG. 10) and a second replacement end effector 56 (shown in FIG. 14). It is contemplated that the replacement of the first end effector 34 and the second end effector 36 be accomplished by aligning the first replacement end effector 54 and the second replacement end effector 56 to the load lock module 14 using a first end effector jig 100 (shown in FIG. 5) and a second end effector jig 200 (shown in FIG. 5). It is also contemplated that alignment provided by the first end effector jig 100 and the second end effector jig 200 match position of the first replacement end effector 54 and the second replacement end effector 56 to positions of the first end effector 34 and the second end effector 36 relative to the processing stage 18 (shown in FIG. 2), respectively, eliminating the need to re-teach placement of the first replacement end effector 54 and the second replacement end effector 56 in the processing module 18 (shown in FIG. 1). As will be appreciated by those of skill in the art in view of the present disclosure, avoiding the need to re-teach placement of the first replacement end effector 54 and the second end effector 54 in the processing module 18 limits downtime associated with the replacement event, e.g., by eliminating the need to install and thereafter remove the transparent cover 44 (shown in FIG. 1) from the housing 42 (shown in FIG. 1), avoiding the requalification operations otherwise associated with installation and removal of the transparent cover 44. Although shown and described herein in the context of a dual arm replacement, it is to be understood and appreciated the method and end effector jigs described herein can be employed to similar advantage during single end effector replacement events as well as in events where more than two end effectors are replaced.

As shown in FIG. 4, initially, the first end effector 34 and the second end effector 36 are placed in a park position wherein each is offset from the load lock module 14. In certain examples, replacement of the first end effector 34 and the second end effector 36 is accomplished after commissioning the semiconductor processing system 10 (shown in FIG. 1) for production. In this respect the semiconductor processing system 10 may be commissioned by positioning a transparent cover, e.g., the transparent cover 44 (shown in FIG. 1), onto the processing module 18 (shown in FIG. 1). In further respect, in certain examples, placement of the first end effector 34 and the second end effector 36 in the processing module 18 (shown in FIG. 1) may be taught by observing position of the first end effector 34 and the second end effector 36 in reaction chambers, and in proximity of processing stages housing therein, of the processing module 18 through the transparent cover 44.

It is contemplated that the first end effector 34 and the second end effector 36 be placed in the park position subsequent to (a) acquiring a first end effector position baseline using the first fixed sensor 30 while transferring a wafer, e.g., the first wafer 22 (shown in FIG. 1), between the first stage 26 and the first end effector 34; (b) acquiring a second end effector position baseline using the second fixed sensor 32 while transferring a wafer, e.g., the second wafer 24 (shown in FIG. 1), between the second stage 28 and the second end effector 36, (c) acquiring a first replacement end effector target position using a carried sensor 50 (shown in FIG. 2) while transferring a camera wafer 52 (shown in FIG. 2) between the first stage 26 and the first end effector 34; and acquiring a second replacement end effector target position using the carried sensor 50 while transferring the camera wafer 52 between the second stage 28 and the second end effector 36. The camera wafer 52 may be an auto teaching system (ATS) wafer arranged for imaging the first stage 26 and/or the second stage 28 during handing and placement of the camera wafer 52 onto the first stage 26 and/or the second stage 28. Examples of suitable camera wafers include WaferSense® Auto Teaching System™ camera wafers, available from the CyberOptics Corporation of Minneapolis, Minnesota.

Figure 5:
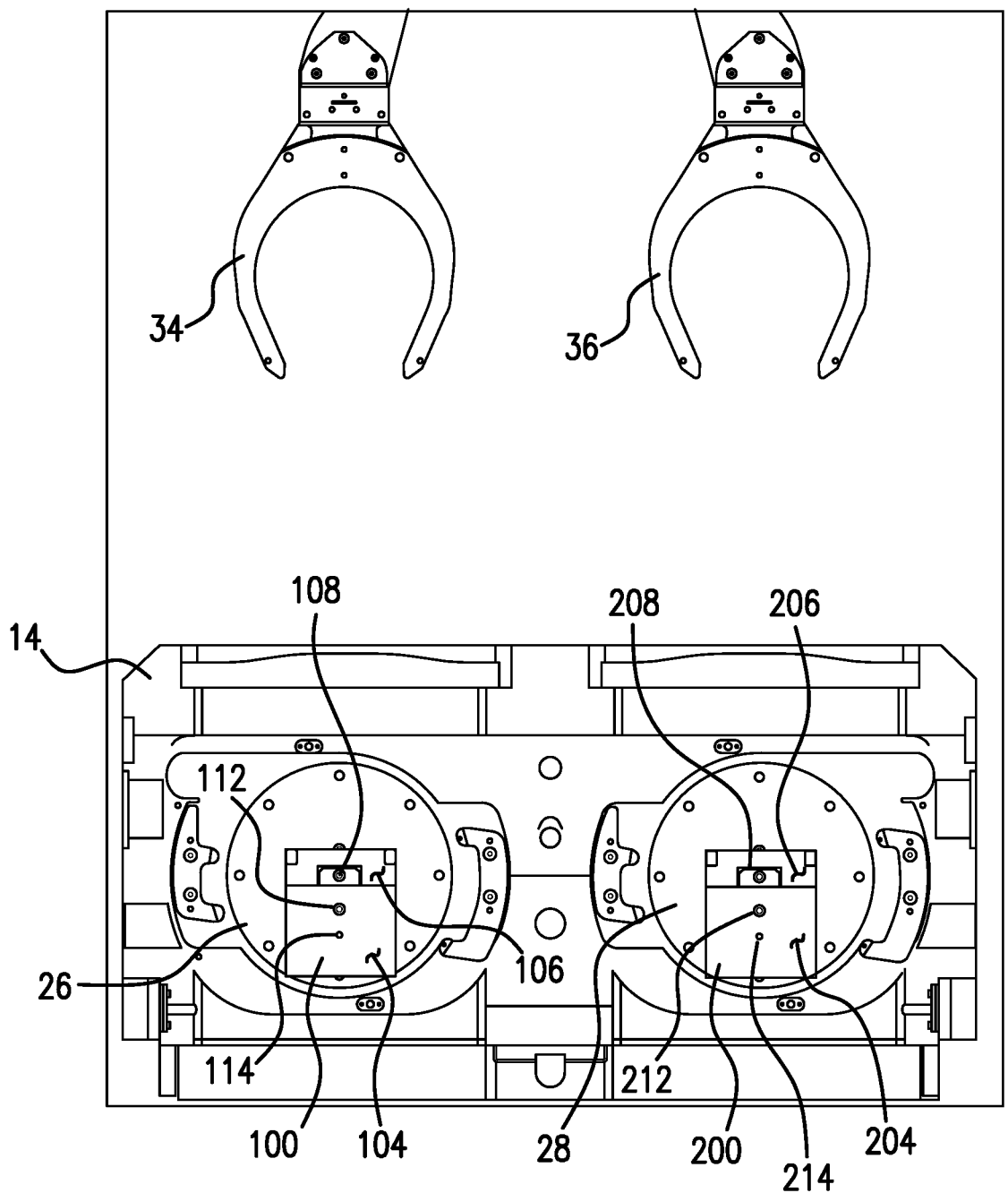
FIG. 5 is a plan view of the load lock module of FIG. 1, showing a first end effector jig and a second end effector jig fixed to the first stage and the second stage, respectively, of the load lock module of the semiconductor processing system.

As shown in FIG. 5, a first end effector jig 100 and a second end effector jig 200 are next installed, i.e., fixed, to the load lock module 14. The first end effector jig 100 is fixed to the first stage 26 of the load lock module 14, and is in turn configured to fix the first end effector 34 and the first replacement end effector 54 (shown in FIG. 10) to the first stage 26 of the load lock module 14. The second end effector jig 200 is fixed to the second stage 28 of the load lock module 14, and is configured to fix the second end effector 36 and the second replacement end effector 56 (shown in FIG. 14) to the second stage 28 of the load lock module 14. In certain examples, the first replacement end effector 54 and the second replacement end effector 56 may be identical to the first end effector 34 and the second end effector 36, e.g., during an in-kind replacement event. In accordance with certain examples, either or both the first replacement end effector 54 and the second replacement end effector 56 may be different in arrangement in relation to the first end effector 34 and the second end effector 36, e.g., during an upgrade replacement event.

The first end effector jig 100 includes a first end effector jig stage surface 102 (shown in FIG. 9), a first end effector jig end effector surface 104, and a first end effector jig step 106. The first end effector jig stage surface 102 has a first end effector jig stage fixation aperture 108 (shown in FIG. 9) and a first end effector jig stage alignment aperture 110 (shown in FIG. 9) for alignment and fixation of the first end effector jig 100 to the load lock module 14.

The first end effector jig end effector surface 104 has a first end effector jig end effector fixation aperture 112 and a first end effector alignment aperture 114 for alignment and fixation of an end effector, e.g., the first end effector 34 or the first replacement end effector 54 (shown in FIG. 10), to the first end effector jig 100. The first jig step 106 is between the first jig stage surface 104 and the first jig end effector surface 106 to accommodate alignment of an end effector, e.g., the first end effector 34 or the first replacement end effector 54, by allowing the end effector to overly the first end effector jig 100 (by accommodating the first arm wrist and end effector fixation hardware) during alignment of the end effector to the first end effector jig 100.

Figure 9:
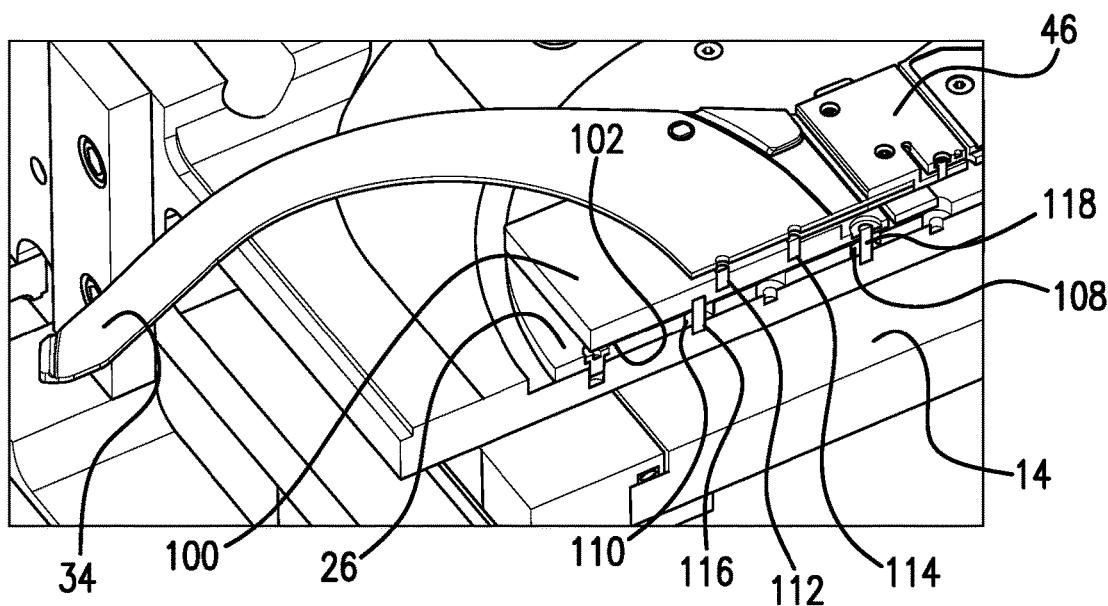

Fixation of the first end effector jig 100 to the first stage 26 is accomplished with a first jig stage alignment pin 116 (shown in FIG. 9) and a first jig stage fixation fastener 118 (shown in FIG. 9). In this respect, once aligned to the first stage 26, the first jig stage alignment pin 116 is slidably received through the first jig stage alignment aperture 110 and into a seat defined in the first stage 26. The first end effector jig 100 is then fixed to the first stage 26 using the first jig fixation fastener 118, which is in turn slidable received through the first jig stage fixation aperture 108 and threadedly fixed in the first stage 26 in a threaded aperture defined in the first stage 26.

The second end effector jig 200 includes a second jig stage surface 202 (shown in FIG. 15), a second jig end effector surface 204, and a second jig step 206. The second jig stage surface 202 has a second jig stage fixation aperture 208 (shown in FIG. 15) and a second jig stage alignment aperture 210 (shown in FIG. 15) for alignment and fixation of the second end effector jig 200 to the second stage 28 of the load lock module 14. The second jig end effector surface 204 has a second jig end effector fixation aperture 212 and a second jig end effector alignment aperture 214 for alignment and fixation of an end effector, e.g., the second end effector 36 or the second replacement end effector 56, to the second end effector jig 200. The second jig step 206 is between the second jig stage surface 204 and the second jig end effector surface 206 to accommodate alignment of an end effector, e.g., the second end effector 36 or the second replacement end effector 56, to the second end effector jig 200.

Figure 15:
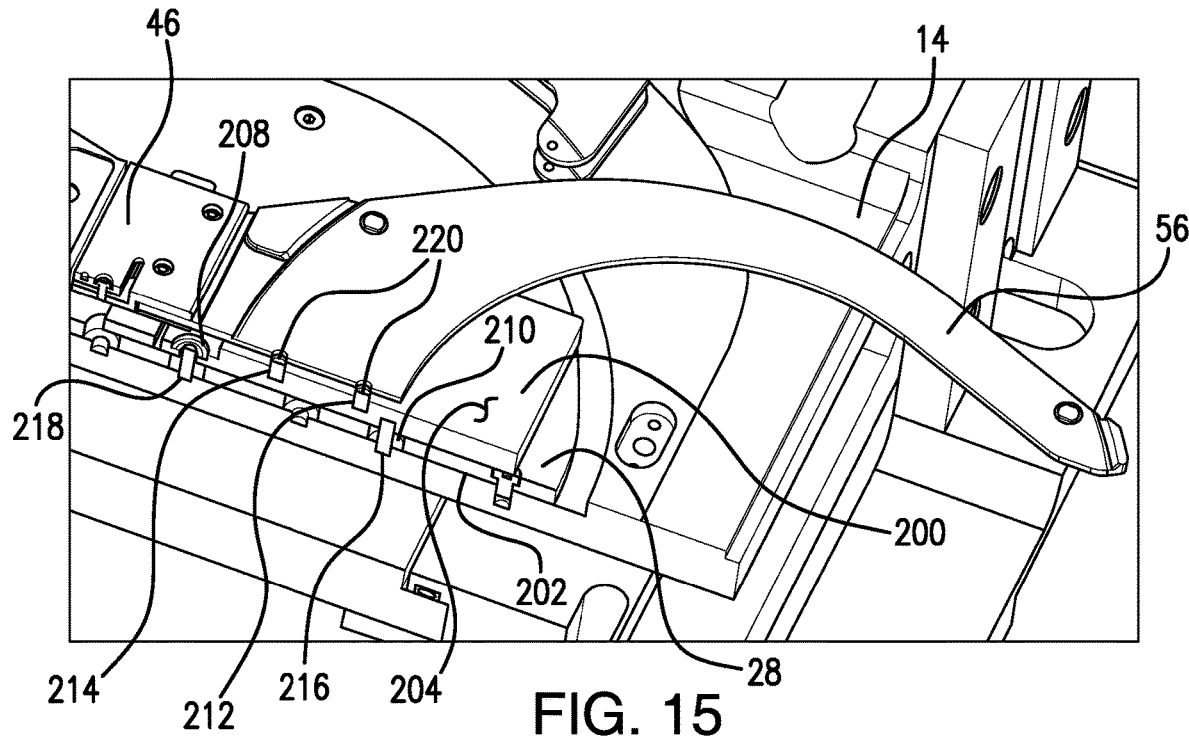
Figure 16:
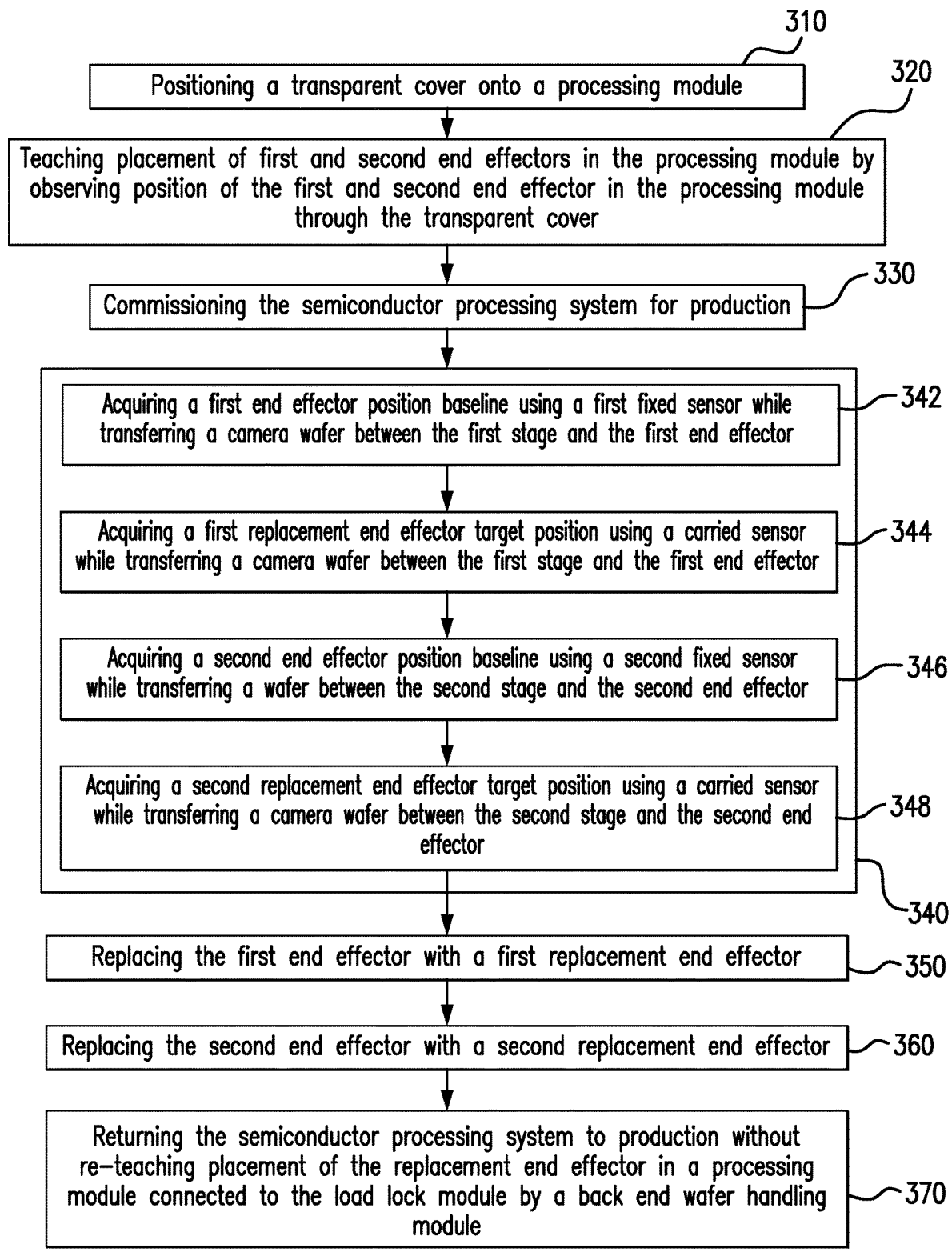
FIG. 16 is a block diagram of a method of replacing an end effector for a wafer handling module in a semiconductor processing system, showing operations of the method according to an illustrative and non-limiting example of the method.

Fixation of the second end effector jig 200 to the second stage 28 is accomplished with a second jig stage alignment pin 216 (shown in FIG. 15) and a second jig stage fixation fastener 218 (shown in FIG. 15). In this respect, once aligned to the second stage 28, the second jig stage alignment pin 216 is slidably received through the second jig stage alignment aperture 210 and into a seat defined in the second stage 28. The second end effector jig 200 is then fixed to the second stage 28 using a second jig fixation fastener 218, which is slidable received through the second jig stage fixation aperture 208 and threadedly fixed in the second stage 28 in a threaded aperture defined in the second stage 28. In certain examples the second end effector jig 200 may be identical to the first end effector jig 100, fixation of the first end effector jig 100 and the second end effector jig 200 to the load lock module 14 being error-proofed in such examples.

Figure 6:
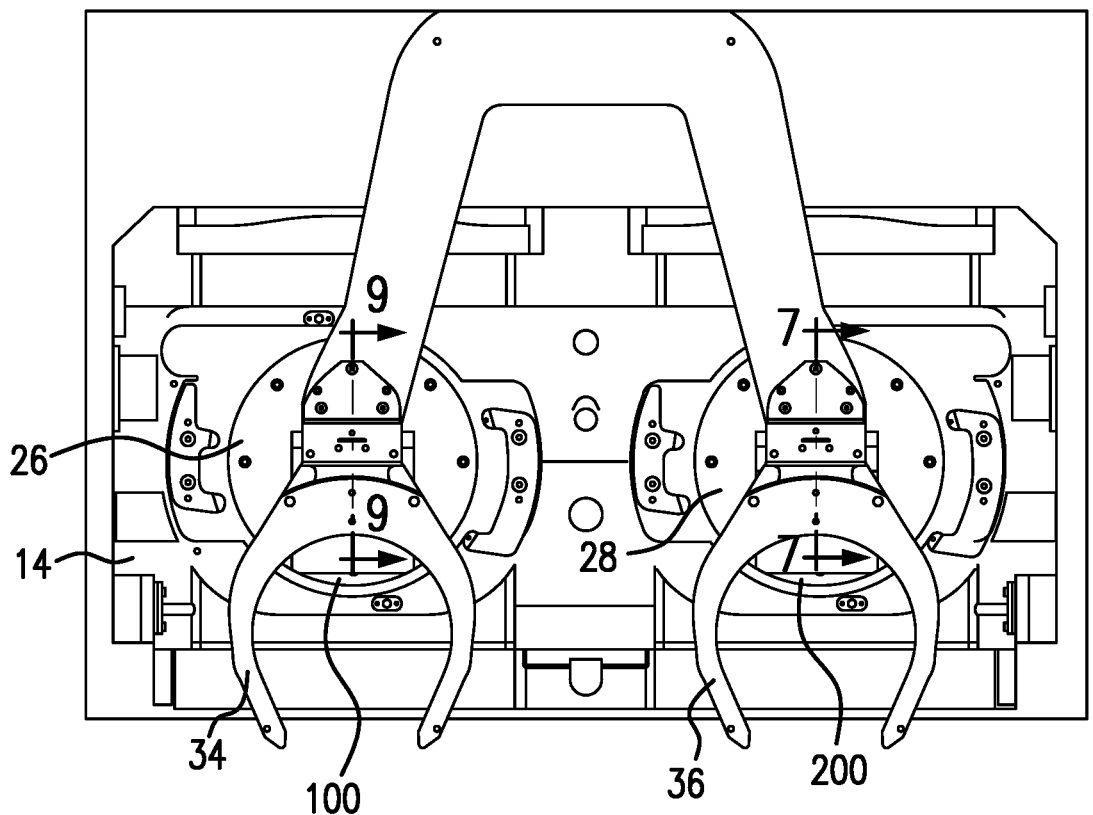
FIGS. 6 and 7 are plan and cross-sectional views of the load lock module of FIG. 1, respectively, showing the first end effector aligned to the first end effector jig and the second end effector aligned to the second end effector jig.
Figure 7:
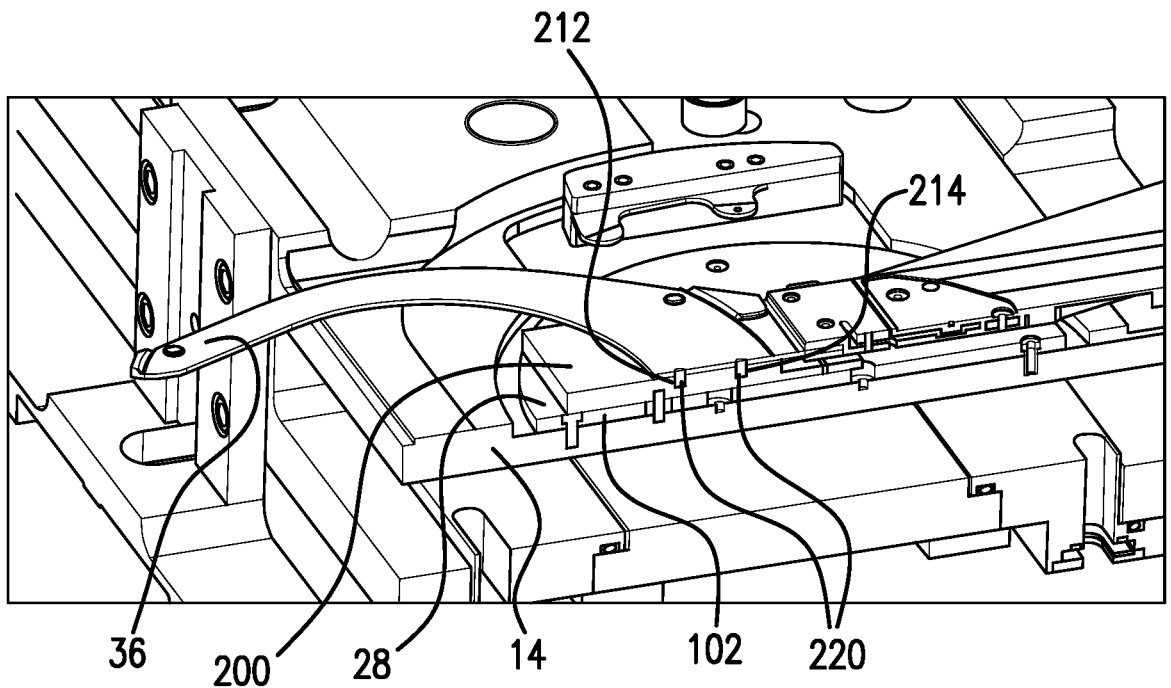

As shown in FIGS. 6 and 7, the first end effector 34 and the second end effector 36 are next aligned to the first stage 26 and the second stage 28, respectively. Aligning the first end effector 34 to the first stage 26 and the second end effector 36 to the second stage 28 ensures that both the first end effector 34 and the second end effector 36 are able to align to the first end effector jig 100 and the second end effector jig 200 at the same time with one another. As shown in FIG. 7, once aligned, the second end effector 36 is fixed to the second end effector jig 200 (and therethrough to the second stage 28) by a second jig end effector pin set 220. It is contemplated that the second jig end effector pin set 220 extend through apertures defined through the second end effector 36 and be slidably received within the second end effector jig end effector alignment aperture 214 and the second jig end effector fixation aperture 212. This fixes the second end effector 36 to second stage 28, the first arm 46 thereby being fixed relative to the first stage 26.

Figure 8:
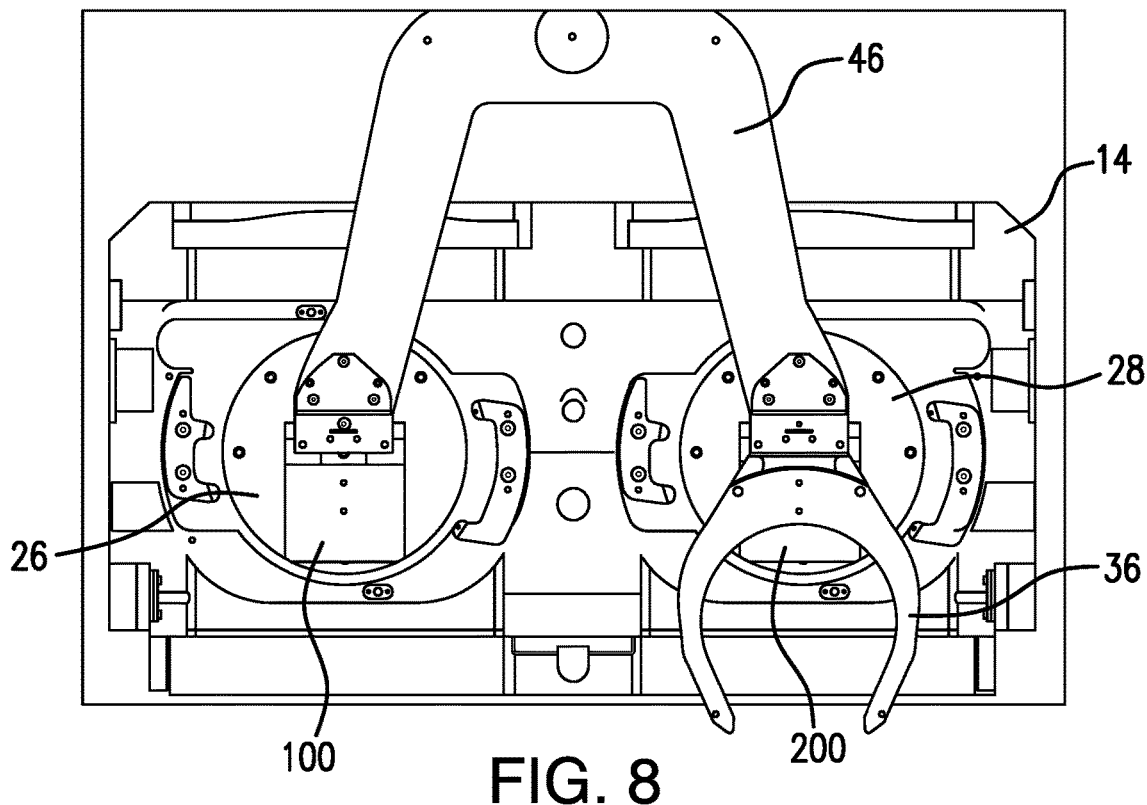
FIGS. 8 and 9 are plan and cross-sectional views of the load lock module of FIG. 1, showing the first end effector removed from the first arm of the wafer handler module while the second end effector is fixed to the second end effector jig by a second end effector jig pin set.

As shown in FIG. 8, alignment of the first end effector 34 to the first end effector jig 100 is verified using registration of apertures defined through the first end effector 34 with the first jig end effector fixation aperture 112 and the first jig end effector alignment aperture 114. As shown in FIG. 9, the first end effector 34 is thereafter removed from the first arm 46. As will be appreciated by those of skill in the art in view of the present disclosure, the first arm 46 remains fixed relative to the first end effector jig 100 via fixation of the second end effector 36 to the second end effector jig 200, and therethrough to the second stage 28 of the load lock module 14.

Figure 10:
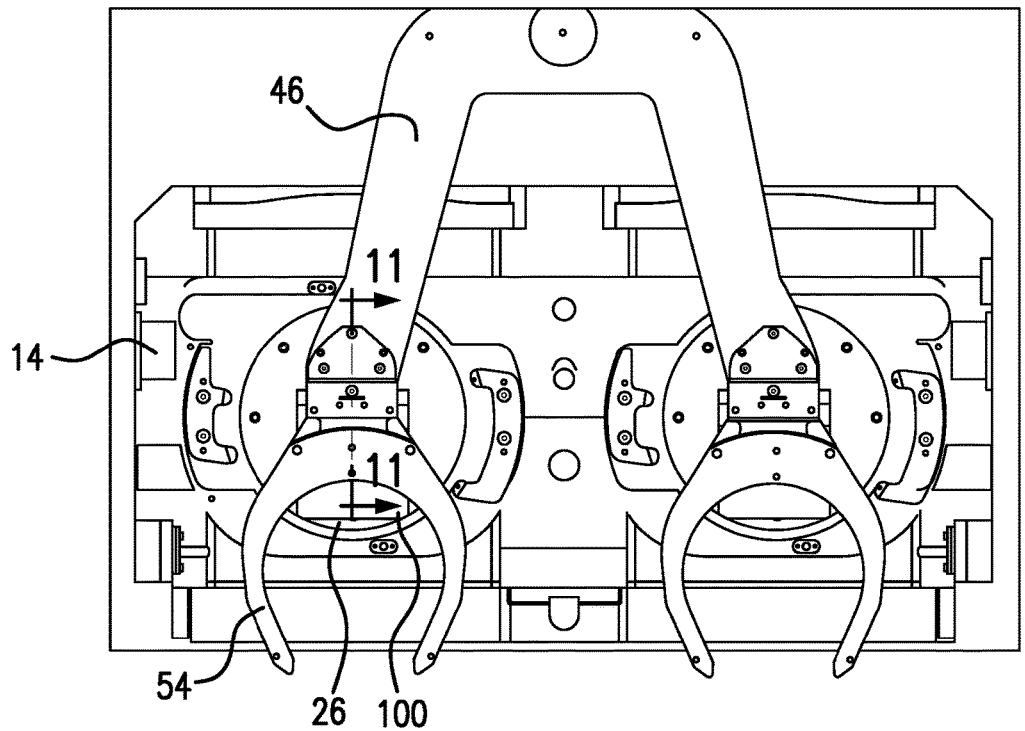
FIGS. 10 and 11 are plan and cross-sectional views of the load lock module of FIG. 1, showing a first replacement end effector being attached to the wafer handler module and aligned to the first end effector jig while the second end effector is fixed to the second end effector jig.
Figure 11:
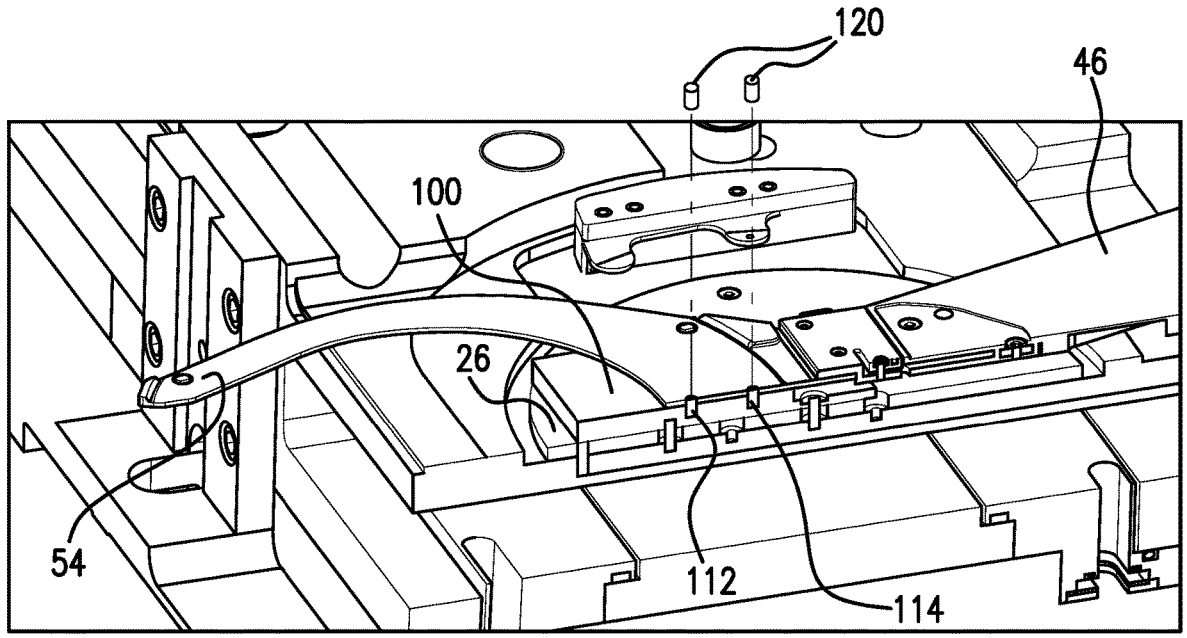

As shown in FIGS. 10 and 11, the first replacement end effector 54 is next installed on the first arm 46 and aligned relative to the first stage 26 using the first end effector jig 100. As shown in FIG. 10, the first replacement end effector 54 is first attached to the first arm 46 and registered to the first end effector jig 100. As shown in FIG. 11, attachment of the first replacement end effector 54 to the first arm 46 is thereafter adjusted by aligning the first replacement end effector 54 such that apertures defined through the first replacement end effector 54 align to the first jig end effector fixation aperture 112 and the first jig end effector alignment aperture 114. Once aligned, a first jig end effector pin set 120 is slidably seated in the first jig end effector fixation aperture 112 and the first jig end effector alignment aperture 114 through the apertures defined through the first replacement end effector 54. As will be appreciated by those of skill in the art in view of the present disclosure, the first arm 46 remains fixed relative to the load lock module 14 during installation of the first replacement end effector 54 onto the first arm 46 as well as during alignment of the first replacement end effector 54 to the first end effector jig 100.

As shown in FIGS. 12 and 13, the second end effector 36 (shown in FIG. 2) is next removed from the first arm 46. As shown in FIG. 12, the second jig end effector pin set 220 are first removed from the second end effector jig 200 and the second end effector 36, i.e., from the second jig end effector fixation aperture 212 and the second jig end effector alignment aperture 214. The second end effector 36 is thereafter removed from the first arm 46. As shown in FIG. 13, the second end effector 36 is then removed from the first arm 46 while the first arm 46 remains fixed relative to the load lock module 14 via the first replacement end effector 54, the first jig end effector pin set 120, and the first end effector jig 100.

As shown in FIGS. 14 and 15, the second replacement end effector 56 is next installed onto the first arm 46. As shown in FIG. 14, the second replacement end effector 56 is installed by registering the second replacement end effector 56 to the second end effector jig 200, and mechanically attaching the second replacement end effector 56 to the first arm 46. As shown in FIG. 15, the second replacement end effector 56 is thereafter aligned to the second end effector jig 200 by aligning apertures in the second replacement end effector 56 with the second jig end effector fixation aperture 212 and the second jig end effector alignment aperture 214, each defined in the second jig end effector surface 204. Once aligned, alignment is verified by inserting the second jig end effector pin set 220 through the second replacement end effector 56 and the second jig end effector fixation aperture 212 and the second jig end effector alignment aperture 214 defined in the second jig end effector surface 204.

Figure 17:
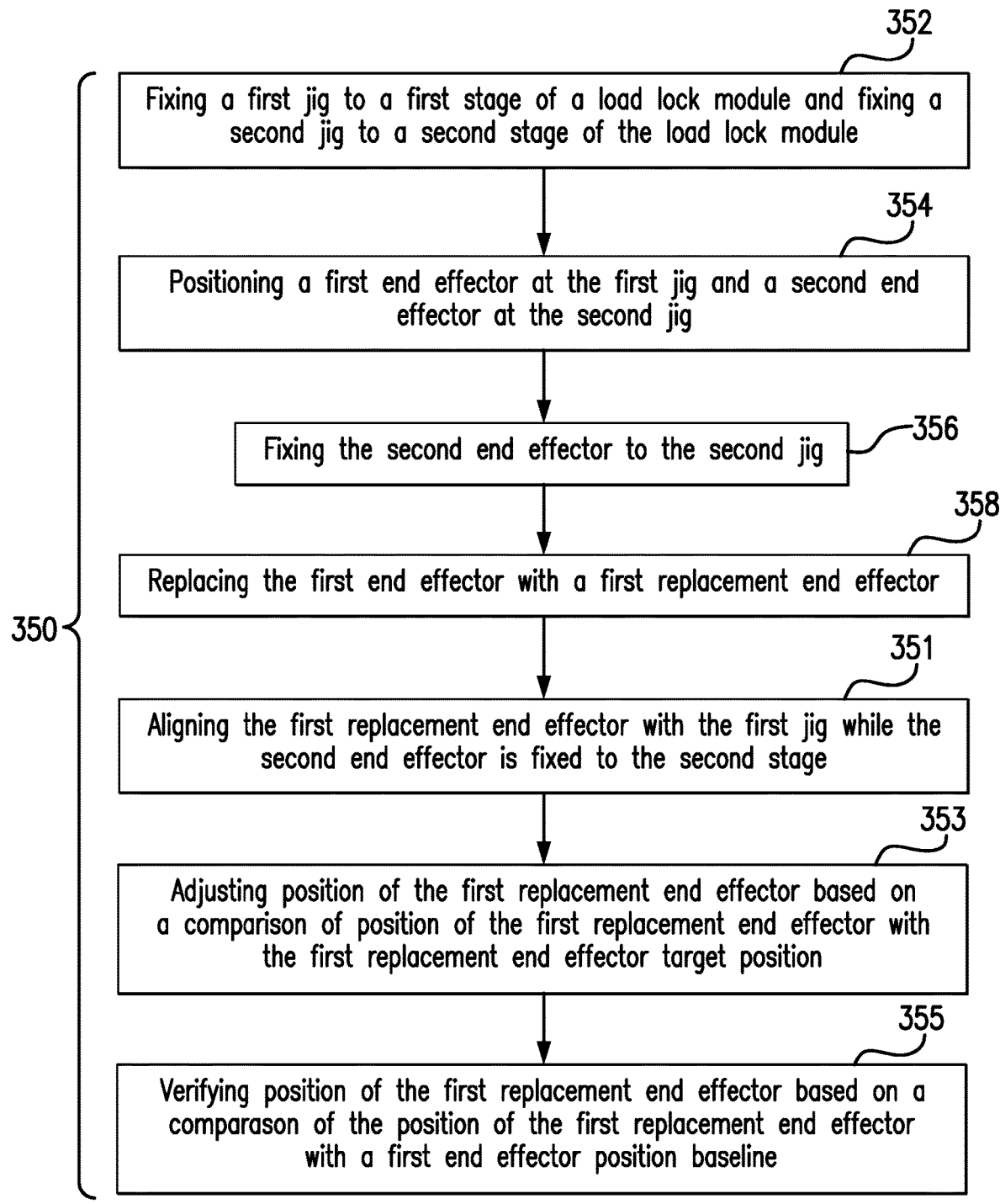
FIG. 17 is a block diagram of a portion of the method of FIG. 16, showing operations for replacing a first end effector with a first replacement end effector.
Figure 18:
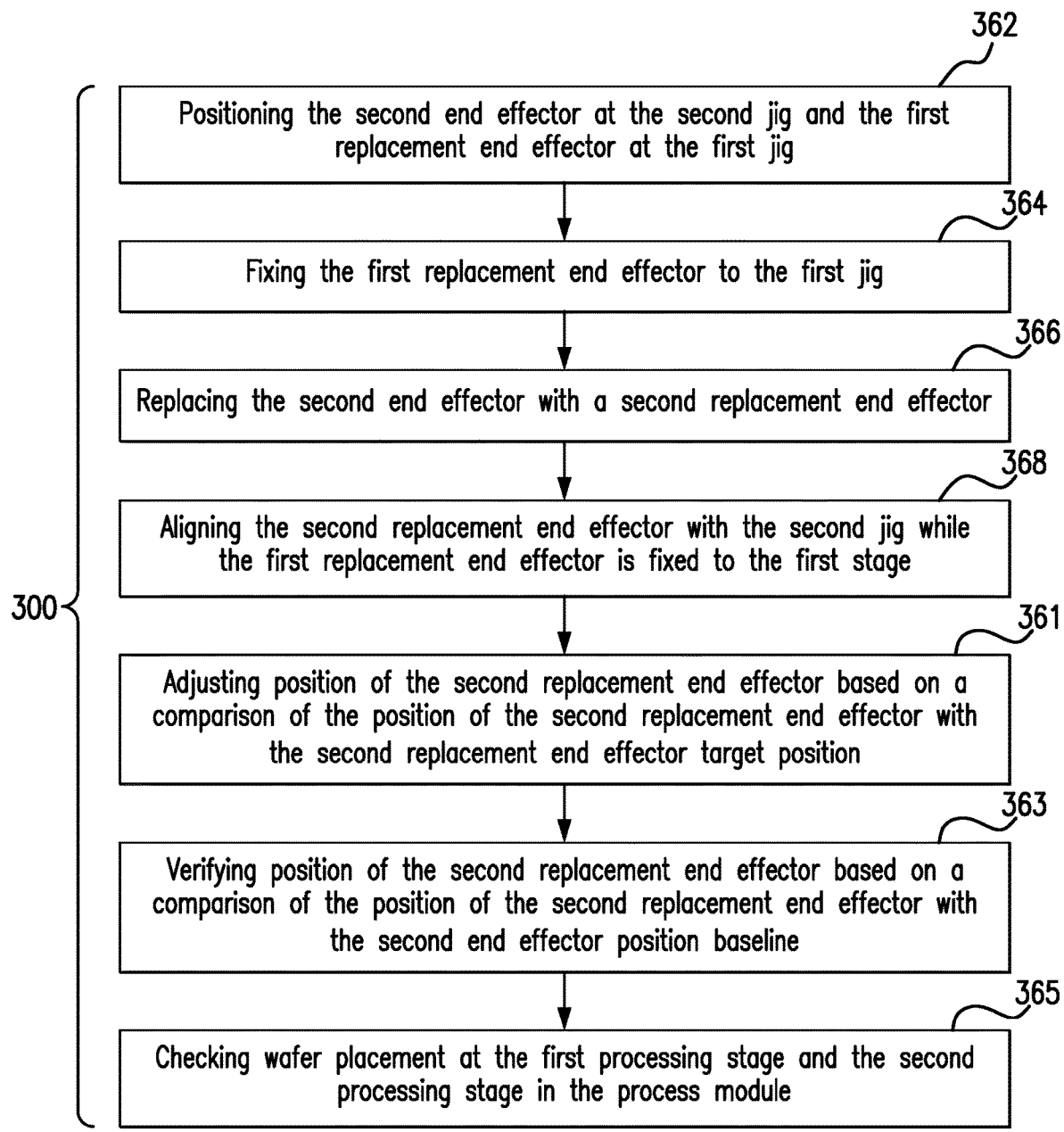
FIG. 18 is a block diagram of another portion of the method of FIG. 16, showing operation for replacing a second send effector with a second replacement end effector.

With reference to FIGS. 16-18, a method 300 of replacing an end effector for wafer handling in a semiconductor processing system, e.g., the first end effector 34 (shown in FIG. 3) and the second end effector 36 (shown in FIG. 3) of the semiconductor processing system 10 (shown in FIG. 1), is shown. As shown in FIG. 16, the semiconductor processing is initially qualified for production with the first end effector and the second end effector. The initial qualification may be accomplished by positioning a transparent cover onto a processing module, e.g., the transparent cover 44 (shown in FIG. 1) positioned onto the processing module 18 (shown in FIG. 1), as shown with box 310. Placement of the first end effector and the second end effector in the processing module is then taught by observing position of the first end effector and the second end effector through the transparent cover, as shown with box 320. Once the placement of the first end effector and the second end effector has been taught the transparent cover is removed, the environment within the processing module restored, and the semiconductor processing system commissioned for production, as shown with box 330.

Replacement of the first end effector and the second end effector is accomplished by acquiring position baselines and target positions for the end effectors and replacement end effectors, respectively, as shown with box 340. The first end effector is then replaced with a first replacement end effector, e.g., the first replacement end effector 54 (shown in FIG. 10), as shown with box 350. In the illustrated example the second end effector is thereafter replaced with a second replacement end effector, e.g., the second replacement end effector 56 (shown in FIG. 14), as shown with box 360. The semiconductor processing system is thereafter returned to production without re-teaching placement of the replacement end effectors in the processing module connected to the load lock module by the back-end wafer handling module, as shown with box 370. As will be appreciated by those of skill in the art in view of the present disclosure, avoiding the need to re-teach placement of the first replacement end effector and the second replacement end effector in the processing module avoids the need install and remove the transparent cover on the processing module. Avoiding installation and removal of a transparent cover limits the downtime otherwise associated with the end effector replacement event.

As shown with box 342, a first end effector position baseline is acquired using a first fixed sensor, e.g., the first fixed sensor 30 (shown in FIG. 4), while transferring a wafer between a first stage of the processing module, e.g., the first stage 26 (shown in FIG. 1), and the first end effector. As shown with box 346, a second end effector position baseline is acquired using a second fixed sensor, e.g., the second fixed sensor 32 (shown in FIG. 4), while transferring a wafer between a second stage of the processing module, e.g., the second stage 28 (shown in FIG. 1), and the second end effector. In certain examples the first end effector baseline and the second end effector baseline may be acquired at the same time, e.g., by cycling a wafer pair between the front-end wafer handling module 12 (shown in FIG. 1) and the processing module 18 (shown in FIG. 1) via the load lock module 14 (shown in FIG. 1) and the back-end wafer handling module 16 (shown in FIG. 1). In accordance with certain examples, the first end effector baseline and the second end effector baseline may be acquired by cycling the wafer pair a predetermined number of times between the front-end wafer handling module and the process module, e.g., ten (10) times by way of non-limiting example. It is contemplated that the first end effector baseline and the second end effector baseline may be acquired using an automatic wafer centering technique.

As shown with box 344, a first replacement end effector target position is acquired using a carried sensor while transferring a camera wafer, e.g., the carried sensor 50 (shown in FIG. 2) of the camera wafer 52 (shown in FIG. 2), between the first stage of the load lock module and the first end effector of the back-end wafer handling module. As shown with box 348, a second replacement end effector target position is acquired using the carried sensor while transferring the camera wafer between the second stage and the second end effector of the back-end wafer handling module. In certain examples, the first replacement end effector target position and the second end effector target position may be acquired using a command carried sensor, e.g., the camera wafer 52. In accordance with certain examples, the first replacement end effector target position and the second end effector target position may be acquired by cycling the carried sensor five (5) times between the first stage and the first end effector, and five (5) times between the second stage and the second end effector, limiting time required for the event while generating target positions of suitable accuracy.

The first end effector baseline is acquired using a first fixed sensor, e.g., the first fixed sensor 30 (shown in FIG. 4), while transferring a wafer between a first stage of the processing module, e.g., the first stage 26 (shown in FIG. 1), and the first end effector. As shown with box 346, a second end effector position baseline is acquired using a second fixed sensor, e.g., the second fixed sensor 32 (shown in FIG. 4), while transferring a wafer between a second stage of the processing module, e.g., the second stage 28 (shown in FIG. 1), and the second end effector. In certain examples the first end effector baseline and the second end effector baseline may be acquired at the same time, e.g., by cycling a wafer pair between the front-end wafer handling module 12 (shown in FIG. 1) and the processing module 18 (shown in FIG. 1) via the load lock module 14 (shown in FIG. 1) and the back-end wafer handling module 16 (shown in FIG. 1). In accordance with certain examples, the first end effector baseline and the second end effector baseline may be acquired by cycling the wafer pair a predetermined number of times between the front-end wafer handling module and the process module, e.g., ten (10) times by way of non-limiting example. It is contemplated that the first end effector baseline and the second end effector baseline may be acquired using an automatic wafer centering technique.

As shown in FIG. 17, replacing the first end effector with the first replacement end effector is accomplished by fixing a first end effector jig to the first stage and a second end effector jig to the second stage, e.g., the first end effector jig 100 (shown in FIG. 5) to the first stage and the second end effector jig 200 (shown in FIG. 6) to the second stage, as shown with box 352. Next, the first end effector is positioned at the first end effector jig and the second end effector at the second end effector jig, as shown with box 354. It is contemplated that the first end effector and the second end effector be positioned at the first stage and the second stage, respectively, at the same time due to the second end effector being fixed relative to the first end effector by the first arm 46 (shown in FIG. 3) of the back-end wafer handling module 16 (shown in FIG. 1). Once positioned at the second stage, the second end effector is fixed to the second stage of the load lock module 14 (shown in FIG. 1), as shown with box 356.

As shown with box 358, the first end effector is then replaced with a first replacement end effector, e.g., the first replacement end effector 54 (shown in FIG. 10). The first replacement end effector is then aligned to the first stage while the second end effector remains fixed relative to the second stage, as shown with box 351, and the first replacement end effector mechanically fixed to the first arm. Position of the first replacement end effector relative to the first processing stage is adjusted based on a comparison of the first replacement end effector with the first replacement end effector target position, as shown with box 353. The position of the first replacement end effector is then verified based on a comparison of the position of the first replacement end effector with the first end effector position baseline, as shown with box 355. Adjustment and verification may be accomplished, for example, by thereafter cycling a wafer pair between the load lock module and/or using a camera wafer to image placement registration of the camera wafer onto the first stage using the first replacement end effector.

As shown in FIG. 18, replacing the second end effector with a second replacement end effector, the second replacement end effector 56 (shown in FIG. 14), is accomplished by positioning the second end effector at the second stage and the first replacement end effector at the first stage, as shown with box 362. Next, the first replacement end effector is fixed to the first stage, as shown box 364. The second end effector is then replaced with the second replacement end effector, as shown with box 366.

As shown with box 368, once attached to the first arm, the second replacement end effector is aligned to the second end effector jig while the first replacement end effector remains fixed to the first stage. Next, position of the second replacement end effector is adjusted based on a comparison of position of the second replacement end effector with the second replacement end effector target position, as show with box 361, and position of the second replacement end effector based on a comparison of the position of the second replacement end effector with the second end effector position baseline, as shown with box 363. The first end effector jig and the second end effector jig are then removed from the first stage and the second stage, and wafer position in the process module checked without directly observing the wafer position through a transparent cover, as shown with box 365. Notably, the replacement may be accomplished without reteaching placement of either (or both) the first replacement end effector and the second replacement end effector in the processing module.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

ELEMENT LISTING

- 10 Semiconductor Processing System
- 12 Front-End Wafer Handling Module
- 14 Load Lock Module
- 16 Back-End Wafer Handling Module
- 18 Processing Module
- 20 Load Port
- 22 First Wafer
- 24 Second Wafer
- 26 First Stage
- 28 Second Stage
- 30 First Fixed Sensor
- 32 Second Fixed Sensor
- 34 First End Effector
- 36 Second End Effector
- 38 First Processing Stage
- 40 Second Processing Stage
- 42 Housing
- 44 Transparent Cover
- 46 First Arm
- 48 Second Arm
- 50 Carrier Sensor
- 52 Camera Wafer
- 54 First Replacement End Effector
- 56 Second Replacement End Effector
- 60 Aligner
- 62 Cold Plate
- 100 First End Effector Jig
- 102 First Jig Stage Surface
- 104 First Jig End Effector Surface
- 106 First Jig Step
- 108 First Jig Stage Fixation Aperture
- 110 First Jig Stage Alignment Aperture
- 112 First Jig End Effector Fixation Aperture
- 114 First Jig End Effector Alignment Aperture
- 116 First Jig Stage Alignment Pin
- 118 First Jig Stage Fixation Fastener
- 120 First Jig End Effector Pin Set
- 200 Second End Effector Jig
- 202 Second Jig Stage Surface
- 204 Second Jig End Effector Surface
- 206 Second Jig Step
- 208 Second Jig Stage Fixation Aperture
- 210 Second Jig Stage Alignment Aperture
- 212 Second Jig End Effector Fixation Aperture Second Jig End Effector Alignment
- 214 Aperture
- 216 Second Jig Stage Alignment Pin
- 218 Second Jig Stage Fixation Fastener
- 220 Second Jig End Effector Pin Set
- 300 Method
- 310 Box
- 320 Box
- 330 Box
- 340 Box
- 342 Box
- 344 Box
- 346 Box
- 348 Box
- 350 Box
- 351 Box
- 352 Box
- 353 Box
- 354 Box
- 355 Box
- 356 Box
- 358 Box
- 360 Box
- 361 Box
- 362 Box
- 363 Box
- 364 Box
- 366 Box
- 368 Box
- 370 Box

The invention claimed is:

1. A method replacing an end effector for wafer handling in a semiconductor processing system, comprising:
fixing a first end effector jig to a first stage and a second end effector jig to a second stage of a load lock module;
positioning a first end effector at the first end effector jig and a second end effector at the second end effector jig, the second end effector fixed relative to the first end effector;
fixing the second end effector to the second end effector jig;
replacing the first end effector with a replacement end effector; and
returning the semiconductor processing system to production without re-teaching placement of the replacement end effector in a processing module connected to a wafer handling module mounting the replacement end effector and the second end effector.

2. The method of claim 1, further comprising acquiring a first end effector position baseline using a fixed sensor while transferring a wafer between the first stage and the first end effector.

3. The method of claim 1, further comprising acquiring a replacement end effector target position using a carried sensor while transferring a camera wafer between the first stage and the first end effector.

4. The method of claim 1, further comprising adjusting position of the replacement end effector based on a comparison of position of the replacement end effector with a replacement end effector target position.

5. The method of claim 1, further comprising verifying position of the replacement end effector based on a comparison of the position of the replacement end effector with a first end effector position baseline.

6. The method of claim 1, further comprising aligning the replacement end effector with the first end effector jig while the second end effector is fixed to the second stage.

7. The method of claim 1, wherein the replacement end effector is a first replacement end effector, the method further comprising:
fixing the first replacement end effector to the first end effector jig;
replacing the second end effector with a second replacement end effector; and
returning the semiconductor processing system to production without re-teaching placement of the second replacement end effector in the processing module connected to the load lock module by the back-end wafer handler module.

8. The method of claim 7, wherein the fixed sensor is a first fixed sensor, the method further comprising acquiring a second end effector position baseline using a second fixed sensor while transferring a wafer between the second stage and the second end effector.

9. The method of claim 7, further comprising acquiring a second replacement end effector target position using a carried sensor while transferring a camera wafer between the second stage and the second end effector.

10. The method of claim 7, further comprising adjusting position of the second replacement end effector based on a comparison of position of the second replacement end effector with a second replacement end effector target position.

11. The method of claim 7, further comprising verifying position of the second replacement end effector based on a comparison of the position of the second replacement end effector with a second end effector position baseline.

12. The method of claim 7, further comprising aligning the second replacement end effector with the second end effector jig while the first replacement end effector is fixed to the first stage.

13. The method of claim 1, further comprising:
positioning a transparent cover on the processing module; and
teaching placement of the first end effector in the processing module by observing position of the first end effector in the processing module through the transparent cover.

14. The method of claim 1, further comprising:
positioning a transparent cover on the processing module; and
teaching placement of the second end effector in the processing module by observing position of the second end effector in the processing module through the transparent cover.

15. A semiconductor processing system, comprising:
a front-end wafer handling module;
a load lock module connected to the front-end wafer handling module, the load lock module having a first stage and a second stage;
a back-end wafer handling module connected to the load lock module, the back-end wafer handling module mounting a first end effector and a second end effector;
a processing module connected to the back-end wafer handling module, the processing module having a first processing stage and a second processing stage;
a first end effector jig fixed to the first stage of the load lock module; and
a second end effector jig fixed to the second stage of the load lock module;
a carried sensor carried by the first end effector and configured to acquire a replacement end effector target position using the carried sensor while transferring a camera wafer between the first stage and the first end effector,
wherein placement of the first end effector in the first processing stage of the processing module corresponds to alignment of the first end effector to the first end effector jig, and
wherein placement of the second end effector in the second processing stage of the processing module corresponds to alignment of the second end effector to the second end effector jig.

16. The semiconductor processing system of claim 15, wherein the first end effector jig is identical to the second end effector jig.

17. The semiconductor processing system of claim 15, further comprising a fixed sensor fixed relative to the first stage of the load lock module and configured to acquire a first end effector position baseline using the fixed sensor while transferring a wafer between the first stage and the first end effector.

18. The semiconductor processing system of claim 15, wherein the first end effector is fixed to the first stage by the first end effector jig.

19. An end effector jig for aligning a replacement end effector to a load lock module in a semiconductor processing system, comprising:
a stage surface with a stage alignment aperture and a stage fixation aperture;
an end effector surface with an end effector alignment aperture, an end effector fixation aperture, and a step;
a stage pin and a stage fastener configured for alignment and fixation of the end effector jig to a stage of the load lock module; and
an end effector pin set configured for alignment and fixation of the replacement end effector to the stage of the load lock module, wherein the step is arranged between stage surface and the end effector surface to allow the replacement end effector to overlay the end effector jig.

* * * * *